(12) United States Patent
Pichler et al.

(10) Patent No.: US 6,911,667 B2
(45) Date of Patent: Jun. 28, 2005

(54) ENCAPSULATION FOR ORGANIC ELECTRONIC DEVICES

(75) Inventors: Karl Pichler, Santa Clara, CA (US); David Lacey, Mountain View, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/300,161

(22) Filed: Nov. 20, 2002

(65) Prior Publication Data

US 2003/0207500 A1 Nov. 6, 2003

Related U.S. Application Data

(63) Continuation-in-part of application No. 10/137,163, filed on May 2, 2002.

(51) Int. Cl.⁷ .......................... H01L 35/24; H01L 21/00
(52) U.S. Cl. .......................... 257/40; 257/787; 438/26; 438/29; 438/30; 438/48; 438/458
(58) Field of Search .................. 257/40, 787, 789; 438/26–30, 48, 108, 118, 455, 458, 758, 762; 430/271.1, 200, 201

(56) References Cited

U.S. PATENT DOCUMENTS

| 6,268,695 B1 | 7/2001 | Affinito |
| 6,410,201 B2 * | 6/2002 | Wolk et al. ................. 430/200 |
| 6,522,067 B1 | 2/2003 | Graff et al. |
| 6,570,325 B2 | 5/2003 | Graff et al. |
| 6,720,203 B2 | 4/2004 | Carcia et al. |
| 2002/0117758 A1 * | 8/2002 | Mukherjee et al. ......... 257/763 |
| 2003/0082889 A1 * | 5/2003 | Maruyama et al. ......... 438/455 |
| 2003/0087476 A1 * | 5/2003 | Oohata et al. ............... 438/108 |
| 2003/0094607 A1 * | 5/2003 | Guenther et al. ............. 257/40 |

FOREIGN PATENT DOCUMENTS

| EP | 1 183 567 B1 | 5/2003 | |
| WO | WO 00/14777 * | 3/2000 | ........... H01L/21/00 |
| WO | WO 01/81649 A1 | 11/2001 | |
| WO | WO 02/05361 A1 | 1/2002 | |

* cited by examiner

*Primary Examiner*—Hsien-Ming Lee
(74) *Attorney, Agent, or Firm*—Thomas George

(57) ABSTRACT

An embodiment of the present invention pertains to encapsulating an organic electronic device by selectively depositing a catalyst layer and then exposing the catalyst layer to a monomer to produce a planarization layer. The monomer reacts only in the areas where the catalyst layer is present so there is minimal or no contamination of other areas of the organic electronic device. Selectively depositing the catalyst layer allows the resulting planarization layer to be patterned. A barrier layer is selectively deposited on at least the planarization layer.

Another embodiment of the present invention pertains to encapsulating an organic electronic device by depositing a planarization layer on a transfer substrate and then allowing it to stabilize to minimize its reactivity. The planarization layer is transferred from the transfer substrate onto at least an active area of the organic electronic device. A barrier layer is selectively deposited on at least the planarization layer.

24 Claims, 13 Drawing Sheets

ENCAPSULATION FOR ORGANIC ELECTRONIC DEVICES

CROSS-REFERENCE TO RELATED APPLICATIONS

This application is a continuation-in-part pursuant to 37 C.F.R. § 1.53(b) of U.S. patent application Ser. No. 10/137,163 filed May 2, 2002 and entitled "Improved Encapsulation for Organic Light Emitting Diodes Devices" . That parent application is incorporated by reference herein in its entirety.

BACKGROUND OF THE INVENTION

One of the last manufacturing steps in the construction of an organic light emitting diode ("OLED") is encapsulation. Encapsulation is a way to protect the OLED device from the damaging environmental effects—primarily from oxygen and moisture. It is well known in the art to encapsulate an OLED device by physically mating a top glass (or other suitable material) layer over, but usually not touching, the OLED device with an epoxy border. The glass, together with its epoxy border, typically is an effective, tried-and-true way to provide the necessary environmental protection required for long-lived OLED usage.

Of late, there has been some discussion in the art to provide a cheaper and better manner of encapsulation, called "direct thin-film" encapsulation. In this manner, thin film encapsulation is typically described as a "polymer multi-layer" (PML) comprising alternating and repeating layers of an organic (usually acrylate or the like) and a barrier layer. FIG. 1 depicts a typical PML structure 100 as is currently known in the art. A glass (or other suitable material) substrate 102 provides the support structure for OLED structure 104 formed on top of substrate 102 in any manner known in the art. Layers 102 and 104 form typically the structure that requires encapsulation—either by known techniques or by the encapsulation techniques of the present invention.

Typically, for PML structures, a planarization layer 106 is formed on top of OLED structure 104. Planarization layer 106 typically is an organic layer (e.g. acrylate or the like) and is provided to give a planar surface for the deposition of the PML structure 112a. PML structure 112a typically comprises barrier layer 108 and another planarization layer 110.

Barrier layer 108 typically comprises a sputtered metal, metal-oxide or a dielectric layer. Barrier layer 108 provides the necessary environmental isolation from the corrosive effects of oxygen and moisture. Planarization layer 110 may again comprise an organic layer (e.g. acrylate or the like) and is typically laid down to provide a planar surface for deposition of the barrier layer 108. This entire PML structure 112a may be repeated (e.g. PML structure 112b)—possibly several times—for additional encapsulation of the entire OLED device.

The advantages of direct thin-film encapsulation over the prior art are primarily cost reduction and improved reliability. Using direct thin-film encapsulation, the package may also be thinner and/or lighter and/or mechanically more flexible. Several structures and steps of the prior art may be excluded with this process. For example, there is no need for a separate glass plate, no need for an epoxy seal, no need for a getter (which is typical in the prior art).

One of the problems of the direct thin film encapsulation occurs with the barrier layer. The barrier layer should ideally not contain any point defects (i.e. pin holes) in its surface—otherwise its usefulness as a barrier layer is severely compromised. That is primarily the reason that a planar organic layer is typically used as a substrate upon which the barrier layer is deposited.

This problem is exacerbated during the batch fabrication of many OLED devices upon a single large sheet of glass—such as shown as a top view in FIG. 2. Upon such a single glass sheet 200, several tens (or even hundreds) of OLED devices 202 may be so fabricated. As depicted, OLED devices 202 are typically laid down in rows and columns on a large sheet of glass 200. Typically, each OLED 202 comprises an electrical contact area 204 for electrically mating the OLED device to a driver circuit.

At the thin film encapsulation step, the PML structure is deposited where at least one UV-curable organic liquid material is deposited over the entire glass sheet containing the multiple OLED devices. This organic layer is subsequently cured—followed by a deposition of a barrier layer (e.g. sputtered metal-oxide or dielectric). Such a process may be repeated to form a PML structure—primarily to avoid external particle/dirt-induced pinhole defects. After encapsulation, singulation is performed, for example by forming scribe and break lines 206 upon the entire structure so that individual OLED devices 202 may be separated and further processed.

The problem with this PML technique is that the only part of the device that requires encapsulation is the OLED structure itself—and not, e.g., the electrical contact pads. In fact, the contact pad must typically be exposed for electrical mating with external driver circuitry. So, at a minimum, additional processing must be performed for the removal of the PML structure over these areas.

Another potential problem with the current PML techniques is that by having the PML layer over the scribe and break lines and/or the glue lines the integrity of the sealed package may be deteriorated, for example by delamination of the PML layer over these areas.

Approaches other than PML are known in the prior art that use combination of organic planarizing layers together with inorganic barrier layers to achieve some degree of thin-film direct encapsulation. Organic planarization layers that do not require special cure may be used as well as layers that are electron-beam or thermally cured, in vacuum or gas atmosphere, preferably inert gas. Such organic layers may also be deposited in non-liquid form, e.g. be evaporated or plasma-deposited (e.g. Parylene).

Monomers can be used as the organic planarizing layer. The use of monomers in contact with an active area of an OLED (the active area may be, for example, the area defined by the cathode) can result in the contamination of the OLED (e.g., the OLED develops pin holes). The contamination can occur because the monomer can diffuse before it is cured and migrate through the pinholes and around the edges of the active area. The monomer may not completely cure so there remains a small proportion of uncured monomers that slowly attack the OLED. To overcome this problem, the prior art uses monomers that immediately react upon contact with a surface such as the active area of the OLED or the substrate. The immediate reaction on contact with, for example, the active area results in the monomer not being able to contaminate the OLED through defects (e.g., pin holes) in the active area. The problem with using monomers that immediately react is that since they disperse everywhere, there is no opportunity to pattern the organic planarization layer. Therefore, it is desirable to have a planarization layer that can be patterned and that minimally contaminates the OLED.

If the method used to deposit the barrier layer onto a device is reactive, then the deposition of the barrier layer may damage the organic electronic device that is to be encapsulated. To avoid such damaging reactions, the planarization layer is deposited using less reactive methods such as evaporation, screen printing, or ink-jet printing. However, if solvents are used to form uniform films of the planarization layer, then these solvents may react with the device to be encapsulated resulting in damage to that device. Also, the planarization layer itself may react with the device to be encapsulated although not as much as the barrier layer deposited by a reactive method. Therefore, it is desirable to deposit a planarization layer that minimally reacts with the device to be encapsulated while still performing the functions of the planarization layer such as minimizing the effects of dirt particles and pinholes.

SUMMARY OF THE INVENTION

An embodiment of a method is described to encapsulate an organic electronic device that satisfies the need to, for example, pattern the planarization layer and that minimally contaminates the device. The embodiment of this method includes fabricating an organic electronic device on a substrate and that organic electronic device has an active area. This embodiment also includes selectively depositing a catalyst layer on at least the active area, exposing the catalyst layer to a monomer to produce a planarization layer where said catalyst layer was selectively deposited, and selectively depositing a barrier layer on at least the planarization layer.

An embodiment of an encapsulated electronic device is described that satisfies the need to, for example, have a patterned planarization layer that minimally contaminates the device. This embodiment of the encapsulated electronic device includes a substrate, an organic electronic device on the substrate and that organic electronic device has an active area, a planarization layer on at least the active area where the planarization layer is formed by selectively depositing a catalyst layer on at least the active area and exposing the catalyst layer to a monomer. In this embodiment, the planarization layer resides where said catalyst layer was selectively deposited. In addition, a barrier layer is on at least the planarization layer.

An embodiment of a method is described to encapsulate an organic electronic device that satisfies the need to, for example, deposit a planarization layer that minimally reacts with the device to be encapsulated while still performing the functions of the planarization layer. The embodiment of this method includes fabricating the organic electronic device on a first substrate and that organic electronic device has an active area. This embodiment also includes depositing a planarization layer on a second substrate, transferring the planarization layer onto at least the active area, and depositing a barrier layer on at least the planarization layer.

An embodiment of an encapsulated electronic device is described that satisfies the need to, for example, have a planarization layer that minimally reacts with the device to be encapsulated while still performing the functions of the planarization layer. The embodiment of this device includes a substrate, an organic electronic device on the substrate and that organic electronic device has an active area, a planarization layer on at least the active area, and a barrier layer on at least the planarization layer. The planarization layer is first deposited on another substrate and then transferred onto at least the active area.

DETAILED DESCRIPTION OF THE INVENTION

Figure 1:
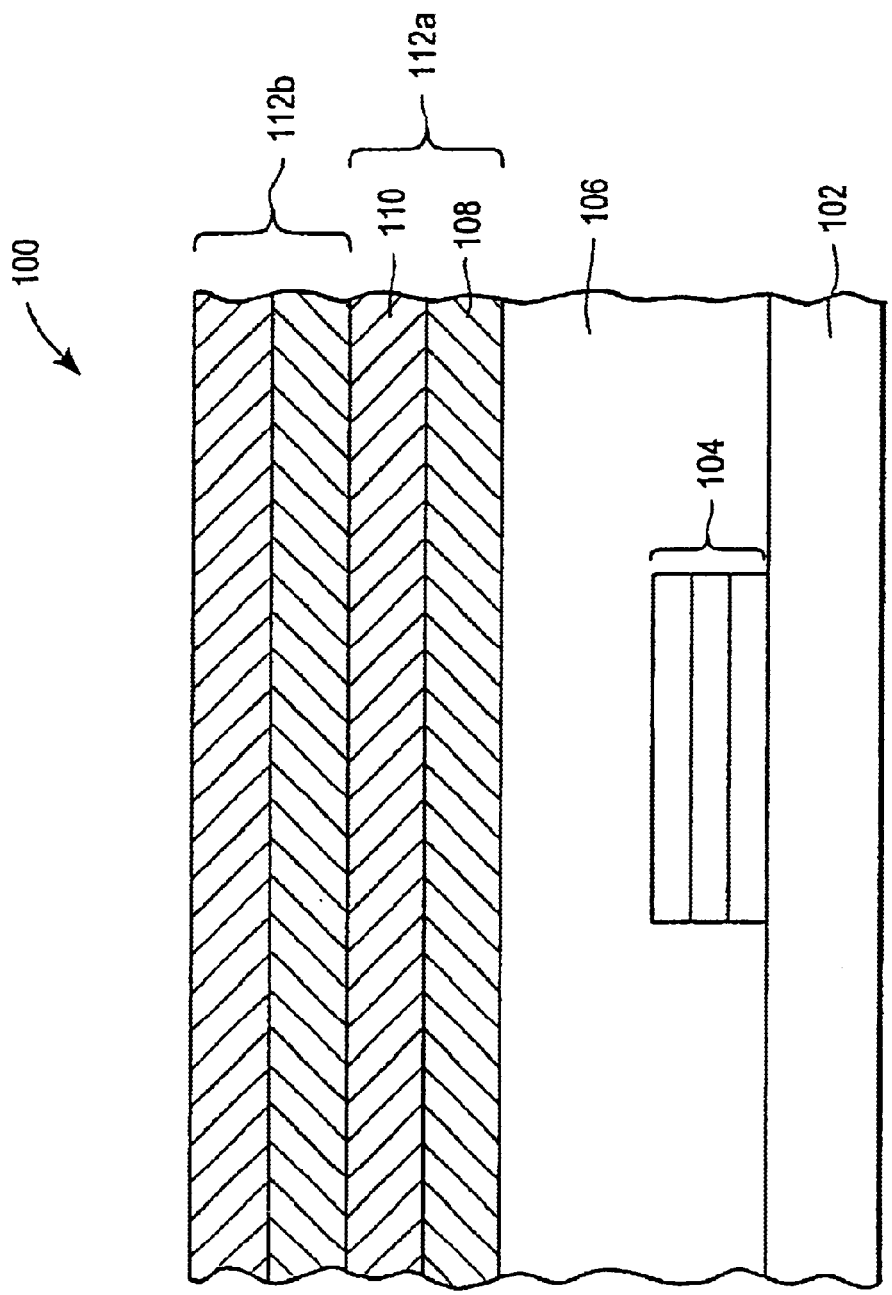
FIG. 1 is side view of a typical PML encapsulation structure formed over an OLED device.
Figure 2:
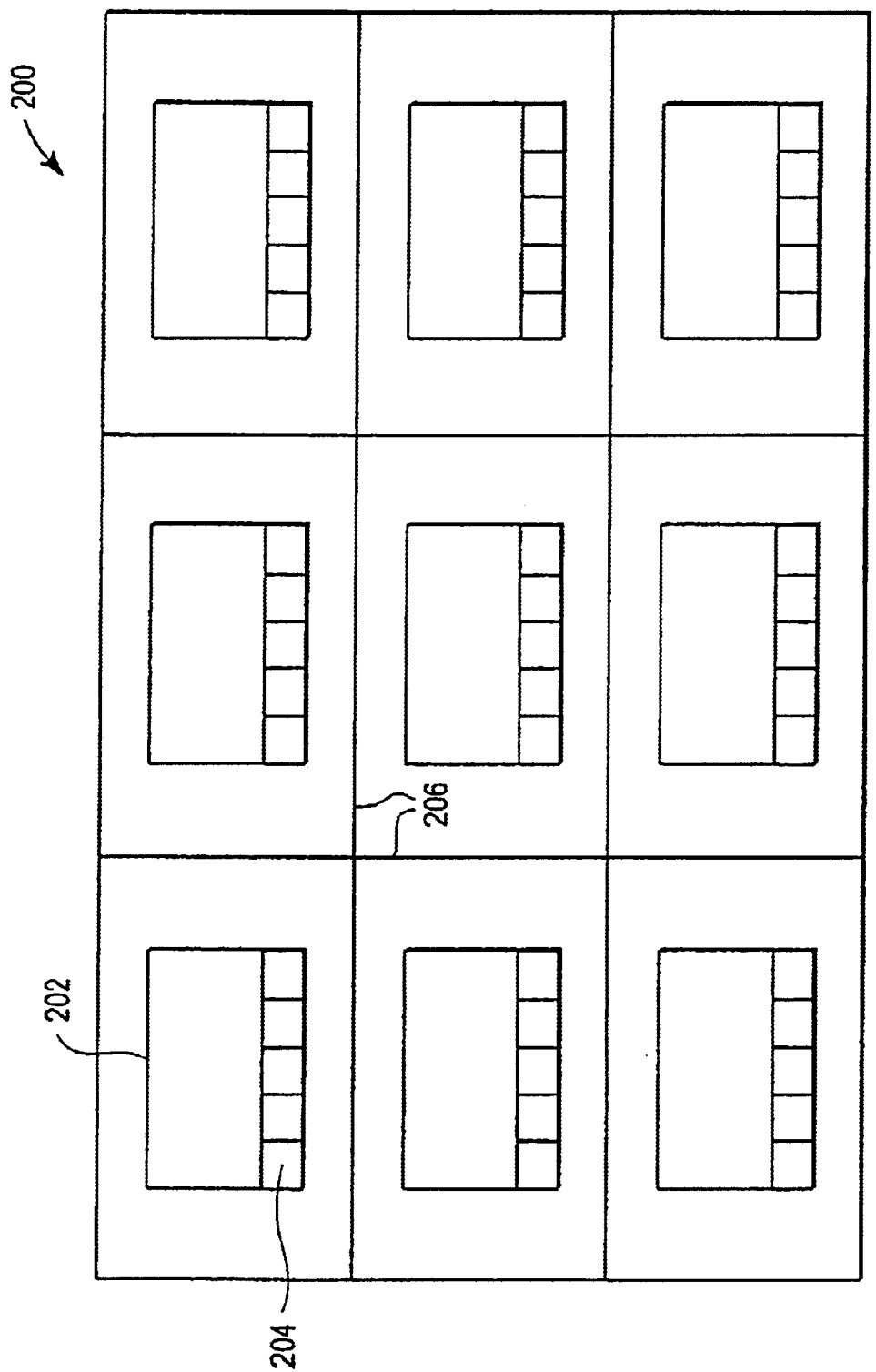
FIG. 2 is a top view of an array of mass-produced OLED structures upon a large glass substrate.
Figure 3A:
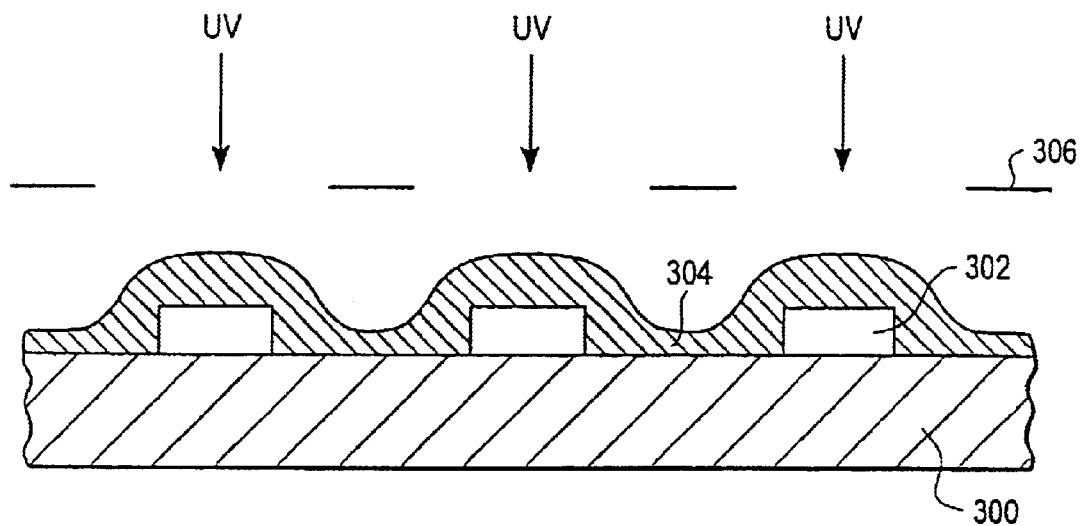
FIGS. 3A and 3B are a set of side view diagrams showing the processing steps of one embodiment of the encapsulation techniques as made in accordance with the principles of the present invention.
Figure 3B:
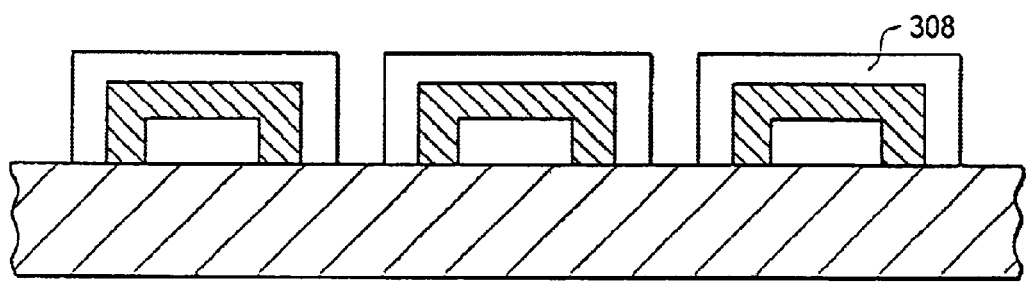

Turning attention to FIGS. 3A–3B, there is shown a series of side views of OLED devices being encapsulated in accordance with the principles of the present invention. In FIG. 3A, substrate 300 has formed upon its surface several OLED devices 302. For the purposes of the present invention, this structure is to be construed very broadly. For example, substrate 300 could be comprised of glass (possibly with ITO as a first electrode), quartz, plastic foils, metal, metal foils, silicon wafers or any other potential substrate material that encompasses very broad classes of OLED devices. Broadly, the OLED device could be bottom-emitting or top-emitting. The device could have the bottom electrode as anode or cathode respectively—in either a top or bottom emitting configuration.

Additionally, the encapsulation techniques and structures of the present invention could be used for any number of applications—e.g. active matrix, passive matrix, segmented, alpha-numeric, or backlight OLED displays or any combination thereof. It will be appreciated that any of these OLED devices could be some that have structures patterned on the OLED substrate that are much higher than the OLED stack itself—e.g. several micron high row separators (e.g. mushrooms) or an ink-confinement well/bank such as used in ink-jet-printed OLEDs. It is intended that the scope of the present invention includes encapsulating over these structures that are within the active areas of the display.

Additionally, it should be appreciated that the scope of the present invention also includes other displays and any electronic or other devices that require encapsulation—e.g. general organic electronic devices such as organic transistors, detectors, solar-cells, etc. (particular OLEDS) and also includes displays for lighting such as OLED-based light sources and backlights.

It should be appreciated that the present invention also comprises a myriad of electronic devices, said devices comprising: a substrate; a plurality of active areas disposed upon said substrate; a plurality of planarization layers disposed on said substrate whereby said planarization layer cover substantially only said active areas; and a plurality of barrier layers disposed on said substrate whereby said barrier layers cover substantially only said planarization layers. In particular, the present invention comprises electronic devices such as an OLED, an organic electronic circuit, an organic detector, an organic solar cell.

A UV-curable organic layer 304 is substantially deposited over the entire display glass comprise a plurality of OLED devices. Such suitable organic layer could be a liquid comprising acrylate, together with a photo initiator for selective curing—or other materials such as generally known in the PML and UV or otherwise curable organic planarization layer technology/prior art.

It should be appreciated that layer 304 could also be any suitable planarization layer. For example, an inorganic or hybrid planarization layer might also suffice as a buffer layer that has desirable planarizing and/or protecting properties from the barrier layer deposition process.

Additionally, a wet-processable and post-processing curable organo-metallic compounds such as spin-on glasses might suffice. Such an organic layer might provide a planar structure on which to deposit a barrier layer and to substantially cover point defects (e.g. dirt particles) in lower layers. It is generally desirable that the organic layer be deposited in sufficient quantity so that any such layer is no longer "conformal" to the point defect—i.e. any point defects are not geometrically projected upwards into layers deposited above. Such a first organic layer might also serve to protect the underlying OLED from potential damage due to the deposition of the first barrier layer.

In yet other embodiments, non-PML approaches could be used within the scope and principles of the present invention. For example, a non-liquid evaporated organic—e.g. polysiloxane as might be applied to later Figures.

It will be appreciated that there are many manners of depositing this organic layer upon the OLED device. For example, the layer could be either evaporated or flash evaporated. Alternatively, a liquid organic layer could be spun coated, dip coated, roll coated, spray-coated or blade coated—as is well known in the art. Additionally, other suitable printing technology could be employed, in particular, screen-printing or ink-jet printing.

Once the organic layer is deposited upon the OLED devices, UV-light is used to selectively cure the layer over the OLED devices to produce the desired cross-linking. This step could be accomplished by a mask 306 which blocks the UV light from areas where it is desired that the organic layer be removed. Alternatively, the cross-linking could be accomplished by using a UV light having an optical patterning system, such as a projection exposure system. In another embodiment, the cross-linking could be accomplished by selectively scanning the UV beam across the plate. In yet another embodiment, the layer need not necessarily have to be UV-cured. Instead, it could be thermally cured—e.g. using a heat source that has a temperature profile, an IR laser, a stencil/stamp, or e-beam cured. Other methods might include: cross-linking, patterned heat transfer system, patterned IR source, masked IR source, scanned IR source, patterned e-beam, masked e-beam and scanned e-beam.

Once the organic layer has been selectively cross-linked, the remaining uncrosslinked layer should be removed. This removal may be accomplished by thermal evaporation (e.g. by heating the substrate) or by using short higher temperature pulses (e.g. placing the OLED plate onto a hotplate). Other removal methods are also possible—e.g. pumping in a vacuum to remove the liquid organic layer. A combination of techniques is also possible—applying thermal energy while pumping in a vacuum.

Still other methods of removal are possible—immersion in a rinse tank, spray-rinsing, ultra-sonicing (either dry or wet), or some combination of techniques (e.g. dry ultrasonic or mega-sonic in a vacuum). Plasma etching techniques could also be employed to aid the removal process. Additionally, laser-assisted methods such as laser ablation or providing heat via laser might suffice.

Once the residual organic layer has been removed, then a barrier layer is selectively deposited on the OLED plate. FIG. 3B shows that barrier layer 308 is selectively deposited over the OLED devices where the organic layer has been also deposited. Barrier layer 308 comprises any material that is suitable to protect the OLED device from the environmental effects of oxygen and moisture—and, as such, should be relatively impervious to them. Such barrier layer material might comprise a metal-oxide or a dielectric layer, e.g. SiOx (e.g. SiO2), SiNx (e.g. Si2N3), SiOxNy, AlOx (e.g. Al2O3), AlNx, ITO, ZnOx, Al-doped ZnOx, or any high barrier dielectrics or conductive oxides. Generally, any inorganic materials known in the prior art that give good oxygen and water barrier properties would suffice for purposes of the present invention. In the case of a bottom emitting display, the encapsulation does not have to be transparent, then metal or alloy films (e.g. Al or alloys, Cr, Cu or alloys, etc.) or non-transparent or colored dielectric films are potentially suitable, both evaporated or sputtered.

The deposition of the barrier layer can be any suitable method known in the art to deposit dielectric layers, metal-oxides, metals or alloys. For example, sputtering or reactive sputtering (DC, AC, pulsed, or a combination thereof) would suffice. Additionally, evaporation of such dielectrics (resistive heating or electron beam) or metal films is possible. Further, ion-beam assisted or other plasma-enhanced deposition methods are also possible.

It should be appreciated that other embodiments are possible. For example, the patterned UV cure described herein could be done such that the thickness of the planarization layer gradually decreases from the value over the active area to zero or near zero somewhere outside the active area. This may facilitate a nice smooth encapsulation of the OLED (or other structures) plus the planarization layer from the active area out to where there is no encapsulation (e.g. scribe/break line and/or contacts). It might be desirable to have the barrier layer slightly larger in area to cover the planarization layer because the planarization layer might not have such a sharp step and such a barrier layer coverage might provide adequate side step coverage. This embodiment applies also to the embodiments discussed herein, as they may be tuned to provide such a smooth transition of the buffer layer by way of re-flow or evaporation or printing or partial pre-cure and the like of the planarization layer at the edges prior to barrier layer deposition. In yet another embodiment, it might be desirable to encapsulate only the organic light-emissive areas (e.g. pixels) and leave the contact pads, auxiliary encapsulation areas, scribe/break areas free of the organic and barrier layers.

Figure 4A:
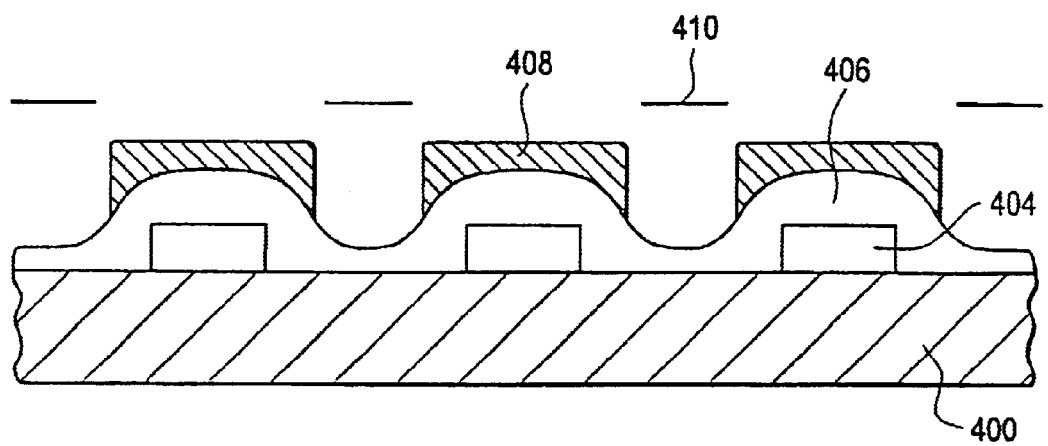
FIGS. 4A and 4B are a set of side view diagrams showing another embodiment of the present invention.
Figure 4B:
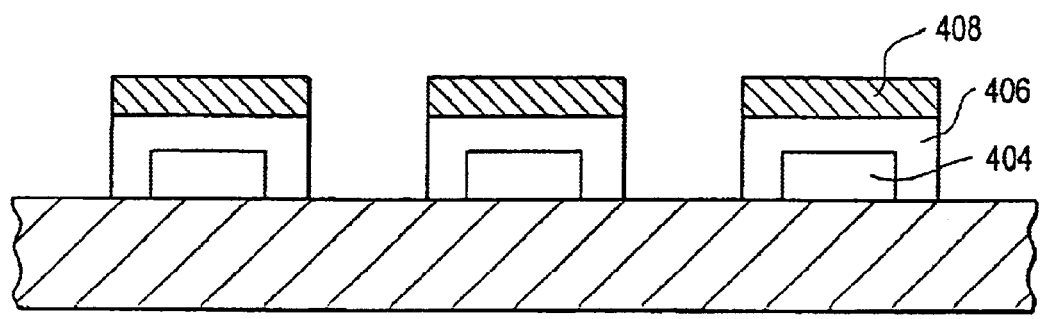

FIGS. 4A and 4B depict another embodiment of the present invention and particularly a different manner of encapsulating OLED devices. FIG. 4A shows a step in the processing of present invention in which OLED devices 404 are formed on top of substrate 402. Organic layer 406 is deposited over the entire substrate, covering OLED devices 404. Then, barrier layer 408 is selectively deposited in a manner known in the art—e.g. through a mask or screen 410—situated on top of the OLED devices. FIG. 4B shows the next step in the processing after that portion of the unwanted organic layer 406 is removed by methods known in the art.

It will be appreciated that organic layer 406 may or may not be cured in its entirety and may or may not be cured selectively through a mask or screen. Likewise, it might be desirable not to cure the organic layer at all. In several embodiments, the organic may be either fully cured before patterned barrier layer deposition, partly cured or completely non-cured and that after the barrier layer deposition, there may be another cure step to ensure that the underlying organic is cured to the intended level, if it wasn't already before the barrier layer deposition. If the unwanted organic layer is etched away (by any number of etching methods known—e.g. chemical (dry or wet) etch, plasma-assisted (with or without oxygen), reactive-ion etching, anisotropic reactive-ion etching, etc.) then barrier layer 408 might act as an effective etch stop as well as laser assisted/based removal (e.g. laser ablation).

In addition, the organic layer could be deposited in any manner previously described (e.g. evaporation of a plurality of reactive organic molecules to form a condensed conformal layer on the substrate) or by well-known Parylene coating methods.

In one embodiment, it may be the case that the edges of the active areas are exposed; however, even if the planarization layer is only a few microns thick and the planarization+ barrier layer perimeter around the active device is tens or even over 100 microns wide, then permeation of e.g. water through this thin planarization layer along the 10's or >100 microns should be slow. Alternatively, a second barrier layer may be larger than the area of the planarization layer so that the exposed planarization layer edge is covered with barrier layer also. This could also be achieved by making a potential second planarization layer+barrier layer stack wider than the first and so on. This can naturally already be done in previous embodiments by making the barrier layer mask wider.

Figure 5:
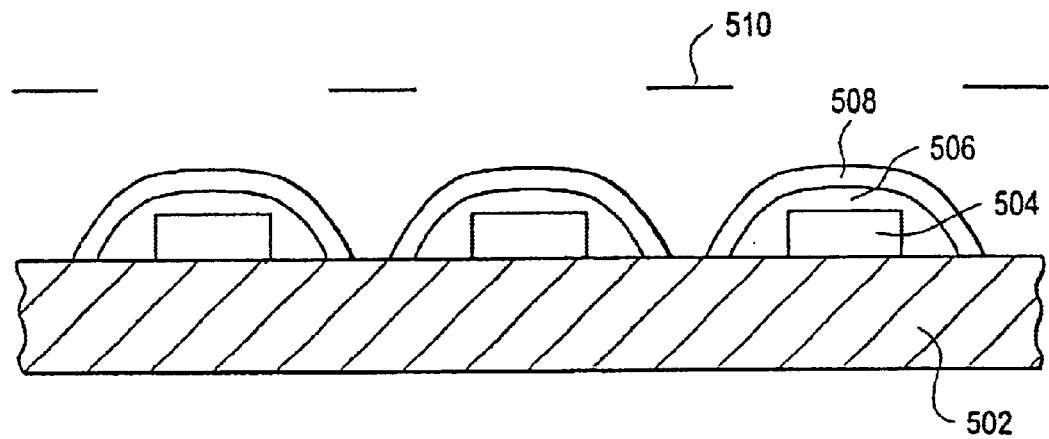
FIG. 5 is a side view of yet another embodiment of the present invention.
Figure 6A:
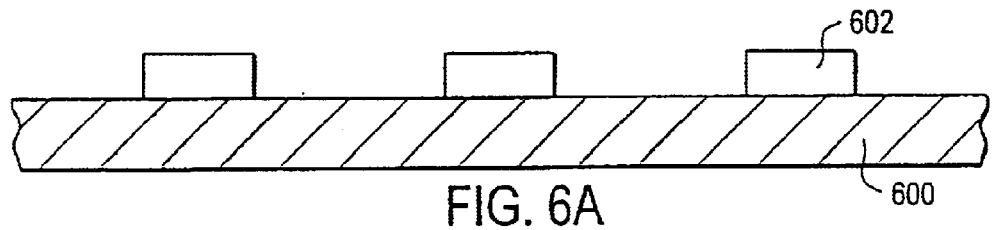
FIGS. 6A through 6E are a set of side view diagrams showing still yet another embodiment of the present invention.
Figure 6B:
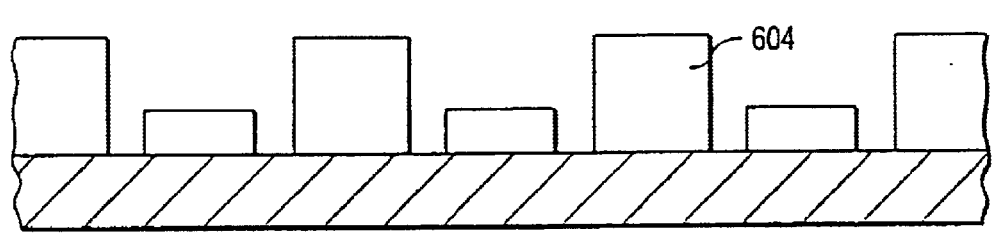
Figure 6C:
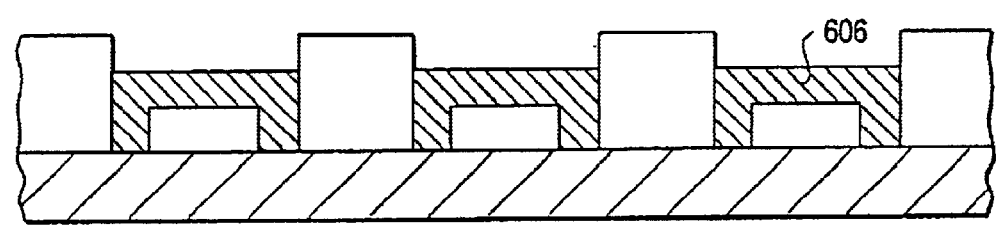
Figure 6D:
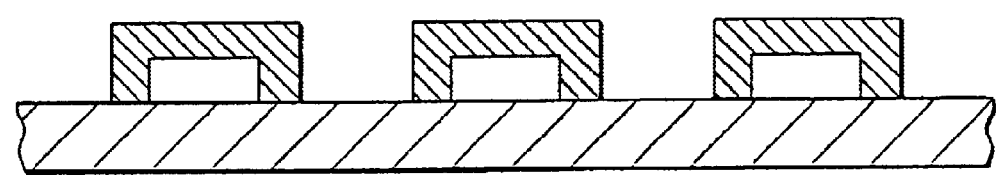
Figure 6E:
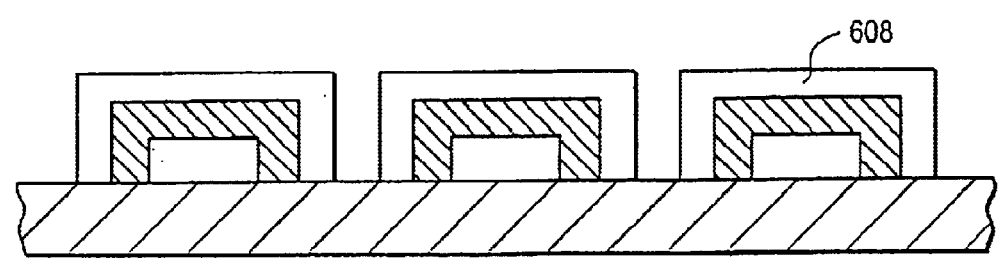

FIG. 5 depicts another embodiment of encapsulation techniques in accordance with the present invention. In this embodiment, OLED device 504 is again formed upon substrate 502. Organic layer 506 is deposited in a patterned fashion as well as barrier layer 508. As organic layer 506 is deposited selectively; there may be no need to cure the layer. It should be appreciated that the cure and patterning aspects could be independent;—relating to the type of material and deposition technique of for the planarization layer. For example, if UV (or other)-curable liquids such as for PML or screen- or ink-jet print are used, then it is possible to cure. Alternatively, if evaporation of an organic through a mask is the relevant step, there may be no need to cure.

The manner of selectively depositing the organic layer and the barrier layer may be accomplished in a variety of ways. For example, organic layer may be selectively deposited though a shadow mask (as depicted as mask 510) or by ink jet deposition or other screen printing techniques. In fact, generally any printing techniques suitable to deliver the desired planarization layer material can be used. In similar fashion, barrier layer 508 may be selectively deposited. For alternative embodiments, it is possible to employ all options for selective deposition: same mask, different masks and also same mask with different substrate to mask distances (e.g. smaller distance for planarizing layer and then larger distance for barrier such that the barrier coverage is wider— because of slight non-directionality of and differences in the materials deposition).

In the case of printing, screen-printing, ink-jet-printing, the masks can either be not required (ink-jet) or possibly different from that used for a patterned sputter-deposited barrier layer deposition. For other embodiments, it may also be possible to partially cure the planarization layer, deposit the barrier layer and then complete the cure of the planarization layer, if necessary.

FIGS. 6A through 6E depict yet another embodiment of encapsulation techniques in accordance with the principles of the present invention. First, OLED device 602 is formed on substrate 600. Then, mask 604 is formed onto substrate 600 with mask openings for OLED devices 602.

It will be appreciated that a suitable mask might be formed in many possible manners. For example, such a mask might be a film laminated to the OLED or a mask pressed or pushed or clamped to the OLED. Additionally, such mask might be a multi-use mask or a one-off that then gets removed. Such mask might comprise a metal, ceramic, or plastic foil or sheet; it could also comprise a PTFE (Teflon) or a poly-siloxane type material (e.g. polydimethylsiloxane) or generally any material that does not stick to the OLED (which might cause damage or delamination when the mask is removed) and/or a material to which the encapsulation organic does not stick so well so that the mask's removal after encapsulation organic deposition and cure (complete or partial) does not remove the organic.

The mask might be such that it could be brought into contact with the OLED sufficiently well so that the encapsulation organic is confined over the desired areas and does not seep under the areas where the encapsulation organic is not desired (e.g. contact pads). Such a mask might comprise a "stamp" mask. Such a mask could be pressed on, clamped on, or the mask could be made of magnetic material and thus held by magnetic forces (e.g. with sheet magnet behind substrate that 'sucks' the mask to substrate). Additionally, the mask could be multi-use mask or one-off use. Vacuum-suction masks may also suffice. Additionally, a laminated film-mask could also suffice.

Once mask 604 is deposited, organic layer 606 is deposited in any suitable manner. For example, organic layer could be dispensed, squashed, rolled, printed, blade-coated, dropped into, sprayed onto the mask openings. Once deposited, then the organic layer may or may not be cured— either partially or completely prior to the removal of mask 604. The mask could be removed by any means known in the art—e.g. by peeling it off; mechanical removal if a stencil, and the like.

It will be appreciated that the edges of the planarization layer may or may not reflow such that the subsequently deposited barrier gives better barrier edge coverage.

After the mask is removed, then barrier layer 608 is selectively deposited over the planarization layers covering the OLED devices. Any known technique for such selective deposition is suitable for purposes of the present invention. For various alternative embodiments, it is possible to either fully cure then remove mask; partly cure then remove mask; no cure then remove mask. These variations may also be in combination with potentially another cure after the barrier layer deposition. Specifically, it might be possible to slightly cure then remove mask then e.g. heat to reflow to smoothen the edges—then continue with full cure/barrier layer deposition.

In yet another embodiment, it is also possible to deposit both the planarization and barrier layer(s) before the removal of the mask.

In yet other embodiments, all encapsulation process steps could be accomplished in an inert atmosphere (i.e. with reduced oxygen, ozone, other reactive gases and in particular moisture). Alternatively, only the first organic layer and first barrier layer ("dyad") could be done in an inert atmosphere. Alternatively, only the first organic layer could be done in an inert atmosphere.

Other embodiments might include encapsulation with a secondary encapsulation layer for additional protection. This might be accomplished by laminating, gluing or otherwise depositing a plastic, metal, metal plus plastic foil, thin glass, thick glass or metal sheet over said OLED display sheet. Said secondary encapsulation may include a getter material (e.g. zeolite, reactive metal, reactive metal-oxide, metal-sulfide, etc.; in film, powder, paste, tablet, etc. form) in the package to absorb water, oxygen or other reactive gases. Singulation could be accomplished either before or after secondary encapsulation.

Figure 7A:
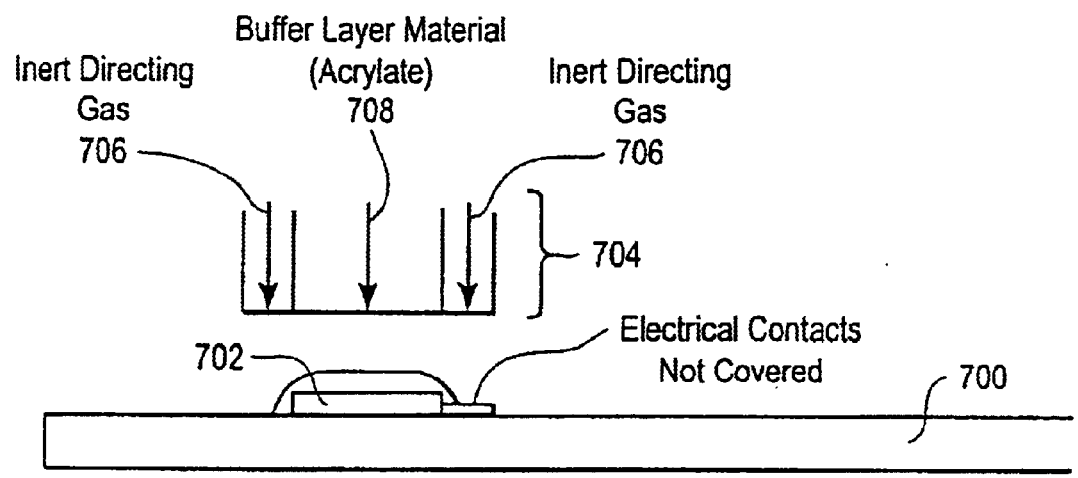
FIGS. 7A through 7C are a set of diagrams depicting a gas nozzle deposition system made in accordance with the principles of the present invention.
Figure 7B:
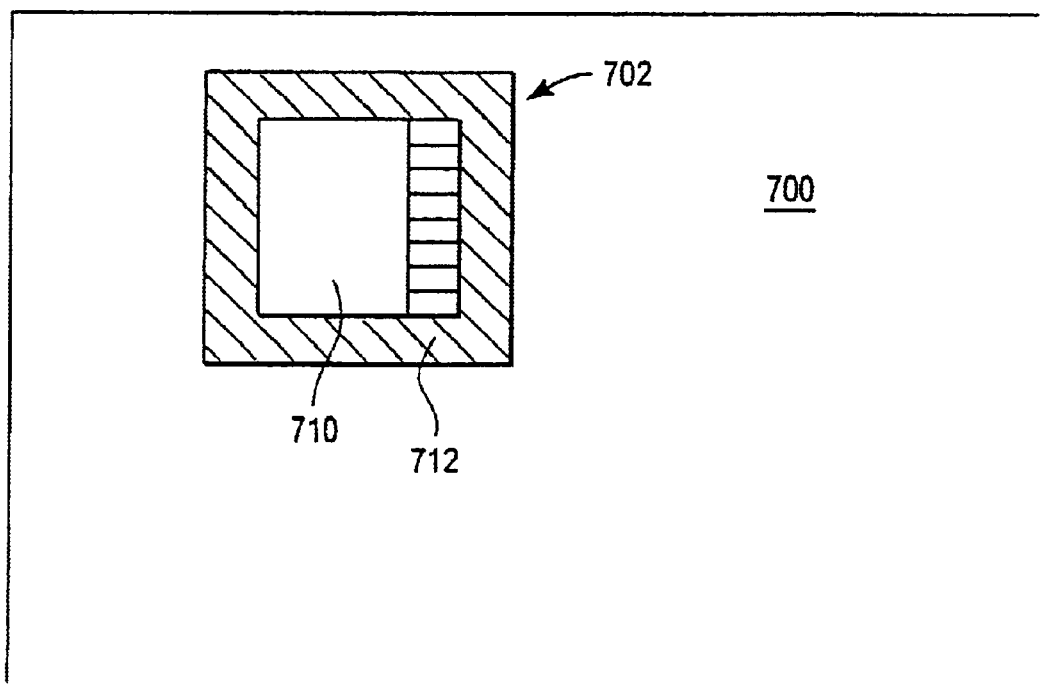
Figure 7C:
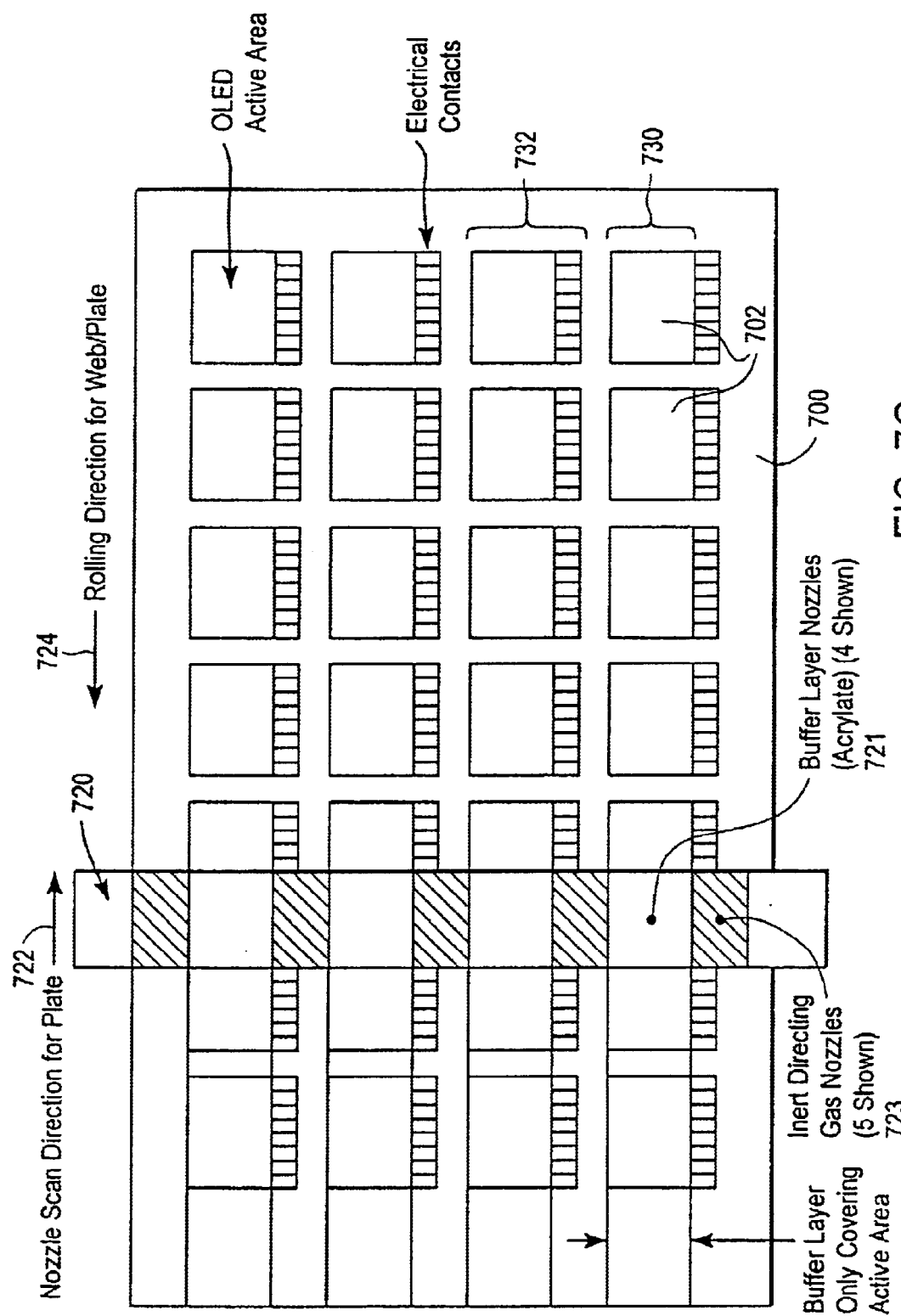

FIGS. 7A through 7C depict a novel gas nozzle deposition system for the deposition of several layers, including the planarization layer. FIG. 7A shows one gas nozzle 704 as it is depositing a layer onto a device 702 upon a substrate 700. Nozzle 704 comprises at least a nozzle 706 that directs a gas, preferably inert, and a nozzle 708 that directs the material to be deposited—e.g. acrylate—onto the device. The gas directs the depositing material away from areas that should be free of deposition. FIG. 7B shows the device 702 after having been covered with the layer by the gas nozzle system. More precisely, area 710 has been covered with the layer—while area 712 is left free of the deposit. Such an area 712 might represent electrical contacts, scribe lines, or other areas that are desired to be free of such deposit.

FIG. 7C depicts the action of an array of such gas nozzles 720 that effects a deposition over a plate 700 of devices 702. Array 720 would comprise a plurality of planarization layer nozzles 721 and inert gas nozzles 723 that are advantageously disposed above the plate of devices so that the layer being deposited is done in only those areas desired. Area 730 is such a desired area for deposition, out of a total area 732 for the device. Array 720 and plate 700 could be placed into relative motion in order to effect an efficient deposition upon a plurality of devices. Direction 722 depicts a possible motion of the array over the plate; while direction 724 depicts a possible motion of the plate under the array—any combination of the two motions are also possible.

FIGS. 8a–h show yet another embodiment of an encapsulated organic electronic device according to the present invention. In this embodiment, the planarization layer is produced by selectively depositing a catalyst layer and then exposing the catalyst layer to a monomer in a gas or a liquid phase, preferably, in the gas phase. The monomer in the gas phase reacts only in the areas where the catalyst layer is present so there is minimal or no contamination of other areas of the organic electronic device. Selectively depositing the catalyst layer allows the resulting planarization layer to be patterned. Since the monomer is polymerized on contact with the catalyst layer, there is minimal opportunity for the monomer to migrate into and contaminate the organic electronic device. The catalyst layer may be, for example, dicyclopentadienyl zirconium borate and the monomer may be, for example, propylene. The planarization layer is used to, for example, bury particles or interrupt the formation of pinholes. A barrier layer is selectively deposited on at least the planarization layer to environmentally isolate the organic electronic device from the corrosive effects of oxygen and moisture. After the planarization layer and the barrier layer are deposited, one or more additional planarization and/or barrier layers can be added to further encapsulate the organic electronic device.

Figure 8A:
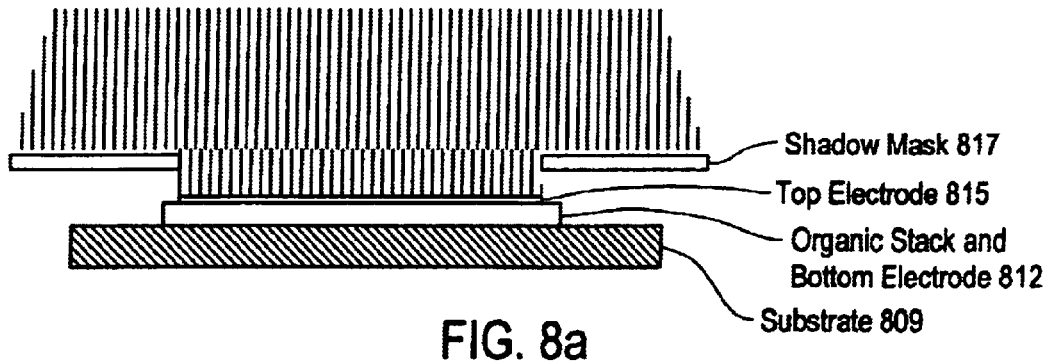
FIGS. 8a–h show yet another embodiment of an encapsulated organic electronic device according to the present invention.

In FIGS. 8a–h, the selective deposition of the catalyst layer occurs using the shadow masked thermal evaporation process. In other configurations, the selective deposition occurs using, for example, printing processes such as ink jet printing, screen printing, flexographic printing, tampon printing, or selective spray-coating. In FIG. 8a, an organic electronic device includes a substrate 809 on which is deposited a bottom electrode and an organic stack 812. The organic stack includes one or more organic layers. The organic stack can include, for example, emissive layers if the electronic device is an OLED, or light-responsive layers if the electronic device is a light detector or a solar cell. The bottom electrode can be for example, an anode or a cathode. As used within the specification and the claims, the terms "on" and "onto" include when layers are in physical contact and when layers are separated by one or more intervening layers. A top electrode 815 is evaporated through a shadow mask 817 and onto the organic stack. The top electrode 815 can be, for example, an anode or a cathode. The top electrode 815 is the active area of the organic electronic device and should be protected by encapsulation.

Figure 8B:
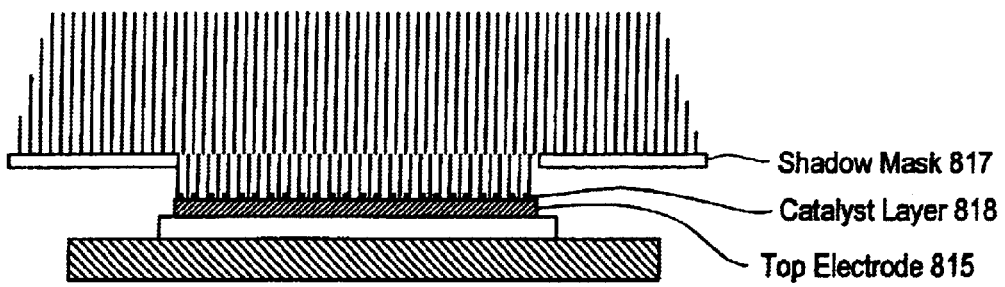
Figure 8C:
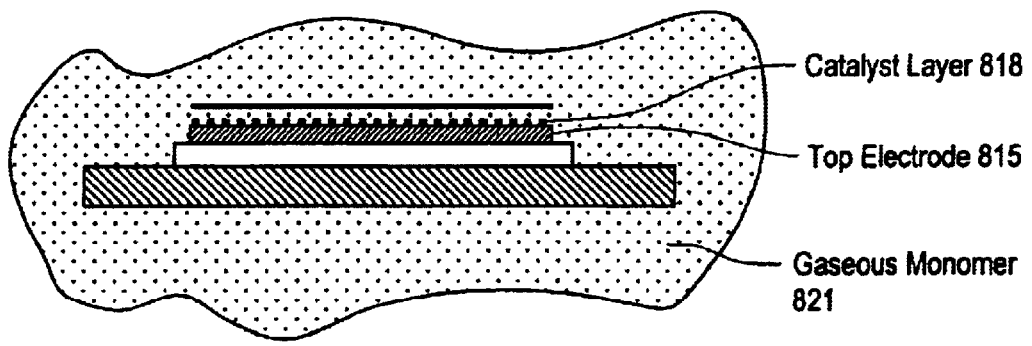
Figure 8D:
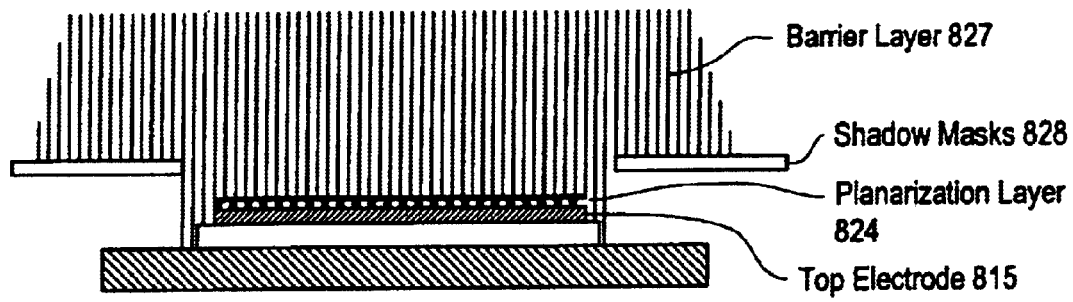
Figure 8E:
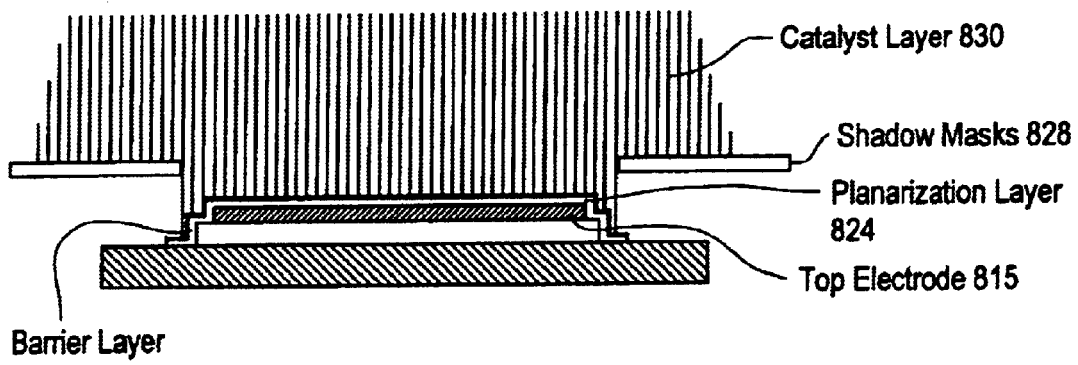
Figure 8E:
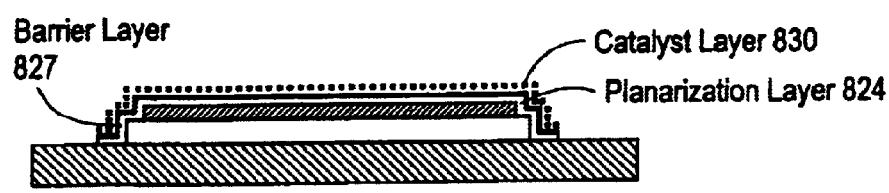

In FIG. 8b, a catalyst layer 818 is evaporated through the shadow mask 817 and onto the top electrode 815. The catalyst layer 818 defines the coverage area of the resulting planarization layer and since the gaseous monomer only reacts in the areas where the catalyst layer is present, the gaseous monomer doesn't contaminate other areas of the organic electronic device. In FIG. 8c, the organic electronic device including the catalyst layer 818 is exposed to a gaseous monomer 821. The gaseous monomer 821 reacts with the catalyst layer 818 to produce a planarization layer 824 on the area where the catalyst layer 818 was selectively deposited. Here, the planarization layer 824 is patterned using the same shadow mask as that used to selectively deposit the top electrode 815 (i.e., a separate shadow mask is not necessary to pattern the resulting planarization layer 824). The gaseous monomer 821 is polymerized on contact with the catalyst layer 818 so there is minimal opportunity for the monomer to contaminate the active area of the organic electronic device. In FIG. 8d, the resulting planarization layer 824 on the top electrode 815 is shown. In FIG. 8d, a different shadow mask is used—a shadow mask 828 has a different opening size than the shadow mask 817. Here, the shadow mask 828 has a larger opening size than the shadow mask 817 thus allowing the evaporated layer to cover a wider area than that possible with the shadow mask 817. A barrier layer 827 is deposited through the shadow mask 828 onto at least the planarization layer 824. The barrier layer 827 is deposited using any process that can deposit highly impermeable barrier layers in a patterned manner. These processes include, for example, evaporation, electron-beam evaporation, direct current ("DC") magnetron sputtering, reactive DC-magnetron sputtering, radio frequency ("RF") or alternating current ("AC") magnetron sputtering, ion-plating, or other plasma-enhanced deposition such as plasma enhanced chemical vapor deposition ("PECVD"). In FIG. 8e, another catalyst layer (i.e., a catalyst layer 830) is evaporated through the shadow mask 828 onto the barrier layer 827. Using the shadow mask 828, the barrier layer 827 and the catalyst layer 830 are evaporated onto a wider area (e.g., an area greater than that of the organic electronic device is covered by the evaporated layers) such that these layers are in contact with the substrate 809 at the edges to ensure a hermetic seal.

Figure 8F:
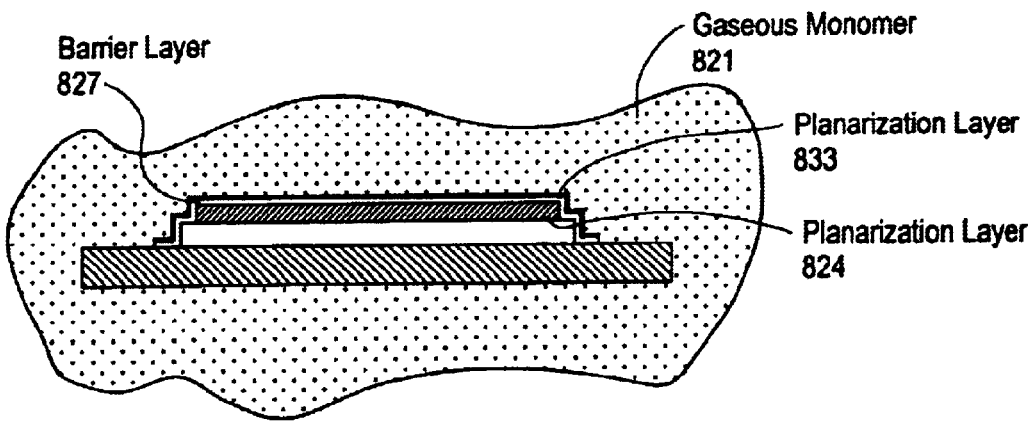

In FIG. 8f, the organic electronic device including the catalyst layer 830 is exposed to the gaseous monomer 821.

Figure 8G:
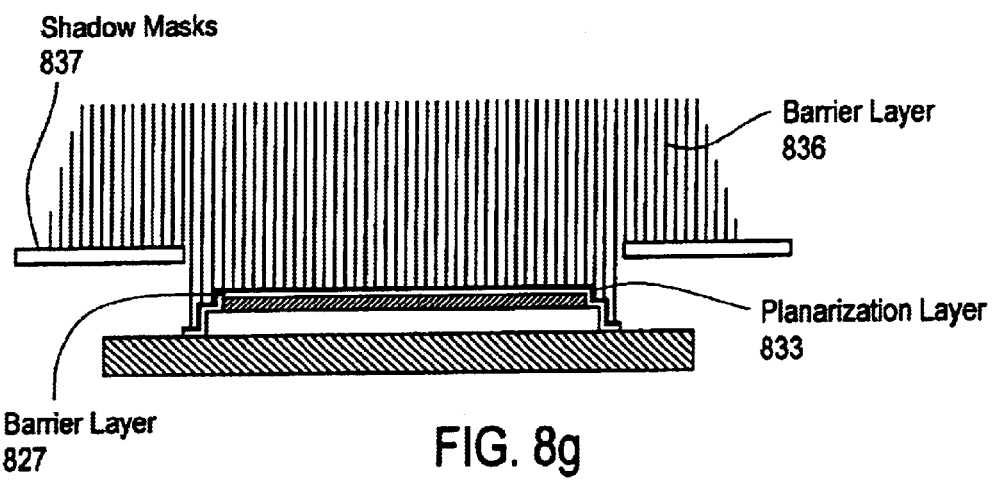
Figure 8H:
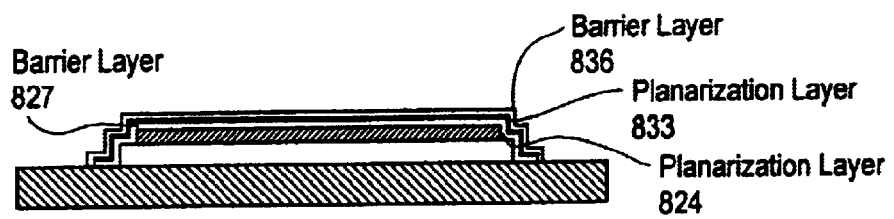

The gaseous monomer 821 reacts with the catalyst layer 830 to produce a planarization layer 833 on the area where the catalyst layer 830 was selectively deposited. The resulting planarization layer 833 is on the barrier layer 827. In FIG. 8g, a different shadow mask is used—a shadow mask 837 has a different size opening (e.g., a larger size opening) than the shadow mask 828. Here, another barrier layer (i.e., a barrier layer 836) is deposited through the shadow mask 837 onto at least the planarization layer 833. In FIG. 8h, the barrier layer 836 on the planarization layer 833 is shown. The depositions shown above in FIGS. 8a–h result in encapsulation of the organic electronic device with two barrier layers with planarization interlayers. These actions can be repeated one or more times to add more planarization and/or barrier layers to further encapsulate the organic electronic device.

The area coated by the deposition can be varied by using shadow masks having different opening sizes or by using different distances between the substrate and the shadow masks or by combinations of both. For example, a larger distance between the substrate and the shadow mask will often result in a larger coated area because many deposition processes such as evaporation or sputtering are not perfectly directional (e.g., perpendicular to the substrate plane). If the area coated by the barrier layer is larger than the area coated by the planarization layer such that the edges of the planarization layer are covered by the barrier layer, then the barrier layer may be able to bond directly with the substrate resulting in improved encapsulation and improved adhesion of the encapsulation layers to the substrate.

Figure 9:
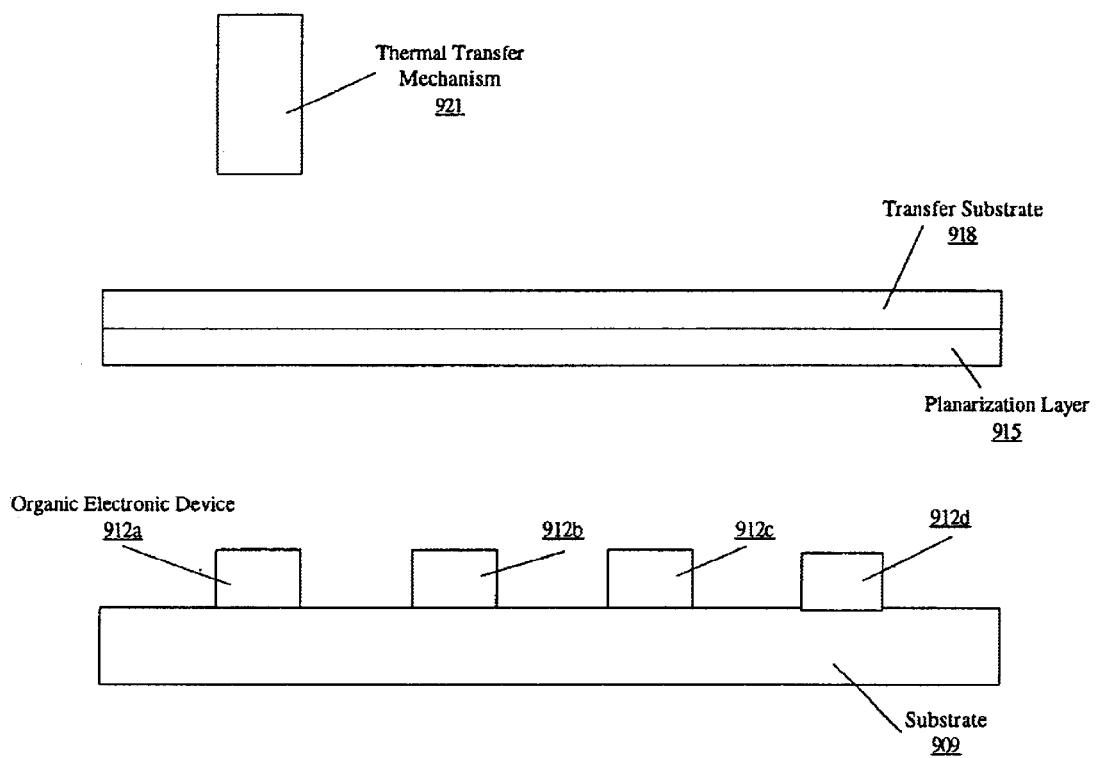
FIG. 9 shows yet another embodiment of an encapsulated organic electronic device according to the present invention.

FIG. 9 shows yet another embodiment of an encapsulated organic electronic device according to the present invention. In this embodiment, a planarization layer is deposited on a transfer substrate and allowed to stabilize to minimize its reactivity with surfaces such as the active area of the organic electronic device. The planarization layer is then transferred from the transfer substrate onto at least the active area of the organic electronic device (e.g., the planarization layer may cover the active area or may hermetically seal the organic electronic device by having the edges of the layer contact the substrate of the organic electronic device). By using the transfer substrate, solvents or reactive monomers used to create the planarization layer do not have contact with the organic electronic device until they are much less reactive. The solvents may be used to form uniform films of the planarization layer. Stabilizing the planarization layer on the transfer substrate includes evaporating solvents from the planarization layer, curing the planarization layer (e.g., the curing can occur using heat or light including ultraviolet ("UV") light), or allowing reactions within the layer to mature to form a more stable and less reactive layer. Also, by using the transfer substrate, the planarization layer can be deposited on the transfer substrate and be stabilized without having to perform this action in a controlled environment such as found in a vacuum chamber. A barrier layer is then deposited onto the planarization layer.

In FIG. 9, a planarization layer 915 is deposited on a transfer substrate 918. The planarization layer 915 is deposited on the transfer substrate 918 in a patterned or an unpatterned manner. If any solvents are used to create the planarization layer 915, these solvents are deposited on the transfer substrate 918 and most if not all of the solvent reactions occur there. The transfer substrate 918 is comprised of, for example, a glass sheet, a plastic sheet, a plastic foil, or a continuous foil based on roll-to-roll techniques. Organic electronic devices 912a, 912b, 912c, and 912d are fabricated on a different substrate such as a substrate 909. A thermal transfer mechanism 921 is used to thermally transfer the planarization layer 915 onto at least the active areas of the organic electronic devices. The thermal transfer mechanism 921 thermally transfers the planarization layer using processes well known in the field of thermal transfer printing such as thermal dye transfer or laser induced thermal imaging ("LITI"). The transfer of the planarization layer 915 from the transfer substrate 918 to at least the active area may be in a patterned or an unpatterned manner. After the planarization layer 915 is transferred, a barrier layer is deposited on at least the planarization layer 915 in a patterned or an unpatterned manner. After the planarization layer 915 and the barrier layer are deposited, one or more planarization and/or barrier layers can be added to further encapsulate the organic electronic device.

The planarization layer 915 can be patterned as it is deposited onto the transfer substrate 918, or can be patterned after its deposition onto the transfer substrate 918, or the transfer of the planarization layer 915 from the transfer substrate 918 to the substrate 909 itself can be in a patterned manner using thermal transfer printing methods that allow for patterning and these methods are well known in the prior art. Also, the planarization layer 915 can be patterned using combinations of the above. If the planarization layer 915 on the transfer substrate 918 is patterned, then, preferably, the transfer of the planarization layer 915 from the transfer substrate 918 to the substrate 909 is not in a patterned manner.

Figure 10:
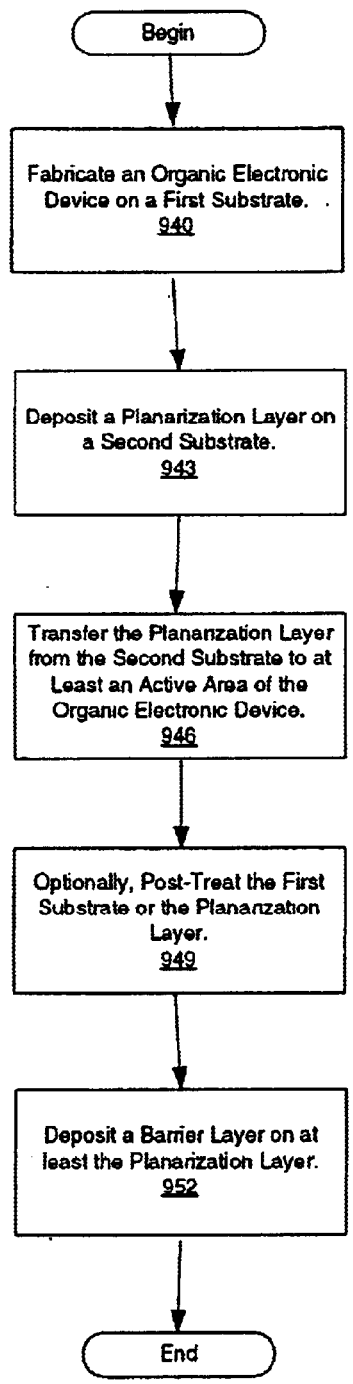
FIG. 10 shows an embodiment of a process to encapsulate an organic electronic device according to the present invention.

FIG. 10 shows an embodiment of a process to encapsulate an organic electronic device according to the present invention. In block 940, an organic electronic device is fabricated on a first substrate. A planarization layer is chosen that is to be deposited on at least the active area of the device. In block 943, the planarization layer is deposited on a second substrate (i.e., a transfer substrate) in a patterned or an unpatterned manner. The organic electronic device that is to be encapsulated is positioned so that the planarization layer on the second substrate can be transferred to the device. In block 946, the planarization layer is transferred from the second substrate to at least the active area of the organic electronic device. The transfer can occur by thermal transfer techniques such as thermal-dye-transfer, thermal transfer printing or LITI. The transfer can occur in a patterned or unpatterned manner. In block 949, optionally, the first substrate or the planarization layer may receive post treatment. The post treatment includes heat treatment to melt, re-flow, or smoothen the planarization layer. The post treatment also includes substantially closing pin holes in the planarization layer, substantially covering point defects (e.g., dirt particles) in the planarization layer, or reflowing the planarization layer under overhanging structures such as a cathode separator. In block 952, a barrier layer is deposited on at least the planarization layer. After the planarization layer and the barrier layer are deposited, one or more planarization and/or barrier layers can be added to further encapsulate the organic electronic device.

It has now been shown several embodiments of advanced encapsulation techniques performed in accordance with the principles of the present invention. It will be appreciated that the present invention is meant to cover any and all obvious variations as described herein.

What is claimed is:

1. A method of encapsulating an organic electronic device, comprising:
 fabricating said organic electronic device on a substrate, said organic electronic device having an active area;
 selectively depositing a catalyst layer on at least said active area;

exposing said catalyst layer to a monomer to produce a planarization layer where said catalyst layer was selectively deposited; and selectively depositing a barrier layer on at least said planarization layer.

2. The method of claim 1 wherein selectively depositing said catalyst layer includes printing said catalyst layer.

3. The method of claim 1 further comprising evaporating through a shadow mask an electrode layer of said organic electronic device, wherein selectively depositing said catalyst layer on at least said active area includes evaporating said catalyst layer through said shadow mask onto at least said electrode layer, and wherein selectively depositing said barrier layer on at least said planarization layer includes depositing said barrier layer through another shadow mask.

4. The method of claim 3 further comprising evaporating another catalyst layer through said other shadow mask onto said barrier layer; and exposing said other catalyst layer to said monomer to produce another planarization layer where said other catalyst layer was selectively deposited.

5. The method of claim 4 wherein said other shadow mask has a different opening size than said shadow mask.

6. The method of claim 3 wherein a distance between said substrate and said shadow mask differ when selectively depositing two different layers.

7. The method of claim 1 wherein selectively depositing said barrier layer includes depositing said barrier layer in a larger area than said catalyst layer.

8. An encapsulated electronic device, comprising:

a substrate;

an organic electronic device on said substrate, said organic electronic device having an active area;

a planarization layer on at least said active area, wherein said planarization layer is formed by selectively depositing a catalyst layer on at least said active area and exposing said catalyst layer to a monomer, wherein said planarization layer resides where said catalyst layer was selectively deposited; and a barrier layer on at least said planarization layer.

9. The electronic device of claim 8 wherein selectively depositing said catalyst layer includes printing said catalyst layer.

10. The electronic device of claim 8 wherein said organic electronic device includes an electrode layer that is evaporated through a shadow mask and wherein said catalyst layer is selectively deposited on at least said active area by evaporating said catalyst layer through said shadow mask onto at least said electrode layer.

11. The electronic device of claim 10 wherein said barrier layer is formed by depositing it through another shadow mask.

12. The electronic device of claim 11 further comprising another planarization layer on said barrier layer wherein said other planarization layer is formed by evaporating another catalyst layer through said other shadow mask and exposing said other catalyst layer to said monomer, wherein said other planarization layer resides where said other catalyst layer was selectively deposited.

13. The electronic device of claim 12 wherein said other shadow mask has a different opening size than said shadow mask.

14. The electronic device of claim 8 wherein said planarization layer is dicyclopentadienyl zirconium borate and said monomer is propylene.

15. The electronic device of claim 8 wherein said organic electronic device is an organic light emitting device, an organic transistor, an organic detector, or a solar cell.

16. A method of encapsulating an organic electronic device, comprising:

fabricating said organic electronic device on a first substrate, said organic electronic device having an active area;

depositing a planarization layer on a second substrate;

stabilizing said planarization layer to minimize its reactivity;

transferring said planarization layer onto at least said active area; and depositing a barrier layer on at least said planarization layer, wherein stabilizing said planarization layer includes evaporating solvents from said planarization layer, curing said planarization layer, or allowing reactions within said planarization layer to mature to form a more stable and less reactive layer.

17. The method of claim 16 wherein transferring said planarization layer includes thermally transferring said planarization layer or transferring said planarization layer using laser-induced thermal imaging.

18. The method of claim 16 wherein depositing said planarization layer includes selectively depositing said planarization layer.

19. The method of claim 16 wherein said planarization layer is patterned when transferring it onto at least said organic electronic device.

20. The method of claim 16 further comprising, upon transferring said planarization layer, treating the imperfections of said planarization layer.

21. An encapsulated electronic device, comprising:

a substrate;

an organic electronic device on said substrate, said organic electronic device having an active area;

a planarization layer on at least said active area; and a barrier layer on at least said planarization layer, wherein said planarization layer is first deposited on another substrate and then transferred onto at least said active area, and wherein prior to transferring said planarization layer, said planarization layer is allowed to stabilize to minimize its reactivity, wherein stabilizing said planarization layer includes evaporating solvents from said planarization layer, curing said planarization layer, or allowing reactions within said planarization layer to mature to form a more stable and less reactive layer.

22. The electronic device of claim 21 wherein said planarization layer is thermally transferred onto at least said active area or is transferred onto at least said active area using laser-induced thermal imaging.

23. The electronic device of claim 21 wherein said planarization layer is patterned.

24. The electronic device of claim 21 wherein said organic electronic device is an organic light emitting device, an organic transistor, an organic detector, or a solar cell.

* * * * *